US009620536B2

(12) United States Patent
Du et al.

(10) Patent No.: US 9,620,536 B2
(45) Date of Patent: Apr. 11, 2017

(54) LTPS ARRAY SUBSTRATE

(71) Applicant: Shenzhen China Star Optoelectronics Technology Co., Ltd., Shenzhen, Guangdong (CN)

(72) Inventors: Peng Du, Guangdong (CN); Yutong Hu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 224 days.

(21) Appl. No.: 14/426,464

(22) PCT Filed: Dec. 29, 2014

(86) PCT No.: PCT/CN2014/095326
§ 371 (c)(1),
(2) Date: Mar. 6, 2015

(87) PCT Pub. No.: WO2016/095263
PCT Pub. Date: Jun. 23, 2016

(65) Prior Publication Data
US 2016/0343747 A1    Nov. 24, 2016

(30) Foreign Application Priority Data

Dec. 16, 2014 (CN) .......................... 2014 1 0784820

(51) Int. Cl.
*H01L 27/12* (2006.01)
*G02F 1/1362* (2006.01)
(Continued)

(52) U.S. Cl.
CPC ........ *H01L 27/1288* (2013.01); *G02F 1/1362* (2013.01); *G02F 1/1368* (2013.01); *G02F 1/13338* (2013.01); *G02F 1/133345* (2013.01); *G02F 1/136209* (2013.01); *G02F 1/136277* (2013.01); *G02F 1/136286* (2013.01); *H01L 27/12* (2013.01); *H01L 27/124* (2013.01);
(Continued)

(58) Field of Classification Search
CPC combination set(s) only.
See application file for complete search history.

(56) References Cited

U.S. PATENT DOCUMENTS

| 2015/0060863 A1* | 3/2015 | Li | ........................ H01L 27/124 257/71 |
| 2015/0311232 A1* | 10/2015 | Sun | .................. G02F 1/136227 257/72 |

\* cited by examiner

Primary Examiner — Kyoung Lee
Assistant Examiner — Ratisha Mehta
(74) Attorney, Agent, or Firm — Andrew C. Cheng

(57) ABSTRACT

An LTPS array substrate includes a plurality of LTPS thin-film transistors and a bottom transparent conductive layer, a protective layer, and a top transparent conductive layer. Each LTPS thin-film transistor includes a substrate, a patterned light shield layer, a buffering layer, a patterned poly-silicon layer, a gate insulation layer, a gate line, and a common electrode line, an insulation layer, a drain and a source, and a planarization layer that are formed to sequentially stack on each other. The light shield layer covers the scan line and the source/drain. A patterned third metal layer is between the bottom transparent conductive layer and the protective layer and includes a first zone and a second zone intersecting the first zone. The first zone shields the source line. A portion of the second zone overlaps a side portion of the light shield layer that is close to the source/drain electrode.

10 Claims, 3 Drawing Sheets

(51) Int. Cl.
*G02F 1/1333* (2006.01)
*G02F 1/1368* (2006.01)
*H01L 29/45* (2006.01)
*H01L 29/49* (2006.01)
*H01L 29/51* (2006.01)
*H01L 29/786* (2006.01)

(52) U.S. Cl.
CPC ........ *H01L 27/1222* (2013.01); *H01L 29/458* (2013.01); *H01L 29/4908* (2013.01); *H01L 29/51* (2013.01); *H01L 29/518* (2013.01); *H01L 29/78633* (2013.01); *H01L 29/78675* (2013.01); *G02F 2001/133357* (2013.01); *G02F 2001/136231* (2013.01); *G02F 2202/104* (2013.01)

LTPS ARRAY SUBSTRATE

CROSS REFERENCE TO RELATED APPLICATIONS

This application claims the priority of Chinese Patent Application No. 201410784820.4, entitled "LTPS Array Substrate", filed on Dec. 16, 2014, the disclosure of which is incorporated herein by reference in its entirety.

BACKGROUND OF THE INVENTION

1. Field of the Invention

The present invention relates to the technical field of display screens, and in particular to a low temperature poly-silicon (LTPS) array substrate.

2. The Related Arts

A LTPS (Low Temperature Poly-Silicon) thin-film transistor liquid crystal display is different from a traditional amorphous silicon thin-film transistor liquid crystal display by having electron mobility higher than 200 cm2/V-sec to effectively reduce the surface area of a thin-film transistor device so as to achieve an increase of aperture ratio and also to reduce the overall power consumption while increasing the brightness of the display. Further, the relatively high electron mobility allows integration of a portion of a driving circuit on a glass substrate, reducing driving IC (Integrated Circuit) and also greatly improving the reliability of a liquid crystal display panel so as to greatly lower down the manufacturing cost of the panel. Thus, the LTPS thin-film transistor liquid crystal display is becoming a hot spot of researches. An LTPS thin-film transistor liquid crystal display generally comprises an array substrate and a color filter substrate opposite to each other. On the other hand, touch function and in-cell capacitive screen arranged as an interior element of a liquid crystal display are increasingly prevailing due to being capable of making a panel light and improving outdoor viewability.

In conventional LTPS array substrates, for a top gate structure TFT, a layer of metallic light shield (LS) pattern is formed on the glass to shield a channel of the TFT. Also, a black matrix is arranged on a surface of the color filter substrate to shield structures that need to be shielded, such as gate lines, data lines, and vias of the TFT unit. This increases the operation of the manufacture thereof and affects the aperture ratio of the substrate.

SUMMARY OF THE INVENTION

The present invention provides an LTPS array substrate, which requires no formation of black matrix so as to save masking operations and increase aperture ratio.

The present invention provides an LTPS array substrate, which comprises a plurality of LTPS thin-film transistors, a bottom transparent conductive layer, a protective layer formed on the bottom transparent conductive layer, and a top transparent conductive layer formed on the protective layer. Each of the LTPS thin-film transistors comprises a substrate;
a patternized light shield layer formed on the substrate;
a buffering layer formed on the substrate and the patternized light shield layer;
a patternized poly-silicon layer formed on the buffering layer;
a gate insulation layer formed on the patternized poly-silicon layer and the buffering layer;
a first metal layer formed on the gate insulation layer, the first metal layer being patternized to form a scan line;
an insulation layer formed on the patternized first metal layer;
a second metal layer formed on the insulation layer, the second metal layer being patternized to form a source line and a source/drain electrode, the source line and the scan line being arranged to intersect each other;
a planarization layer formed on the insulation layer and the patternized second metal layer, the bottom transparent conductive layer being formed on the planarization layer, the patternized light shield layer covering the scan line and the source/drain electrode, a patternized third metal layer, in the form of a grid configuration, being formed between the bottom transparent conductive layer and the protective layer, the patternized third metal layer comprising a first zone and a second zone arranged to intersect the first zone, the first zone shielding the source line, the second zone having a portion overlapping a side portion of the light shield layer that is close to the source/drain electrode.

In the above LTPS array substrate, the patternized third metal layer is a touch sensing electrode layer.

In the above LTPS array substrate, the scan line comprises an extension zone extending therefrom and covering a portion of the patternized poly-silicon layer.

In the above LTPS array substrate, the second zone and the light shield layer are arranged to partly overlap so that the second zone and the light shield layer for a shielding zone in a widthwise direction, the widthwise direction is a direction extending from the scan line of the LTPS thin-film transistor toward the source/drain electrode.

In the above LTPS array substrate, the patternized second metal layer is electrically connected through a via to the poly-silicon layer.

In the above LTPS array substrate, the top transparent conductive layer is formed on the protective layer and is electrically connected through a via to the source/drain electrode.

In the above LTPS array substrate, the gate insulation layer is made of one of silicon oxide (SiOx), silicon nitride (SiNx), and silicon oxynitride (SiNxOy).

In the above LTPS array substrate, the first metal layer and the second metal layer comprise materials that are electrically conductive materials of molybdenum/aluminum alloys and chromium metal.

In the above LTPS array substrate, the bottom transparent conductive layer and the top transparent conductive layer are made of transparent conductive materials.

In the above LTPS array substrate, the third metal layer has a grid configuration.

The present invention provides an LTPS array substrate that has a patternized light shield layer of which the width is increased so as to shield source/drain electrodes and a scan line and partly overlaps a patternized third metal layer that serves as a touch sensing electrode layer, allowing for shielding of potential light leakage sites of the entirety of an LTPS thin-film transistor, and also, a first zone shields a source line, whereby the entire arrangement of the array substrate saves the manufacture of a black matrix so as to save masking operations and increase aperture ratio.

BRIEF DESCRIPTION OF THE DRAWINGS

To more clearly explain the technical solutions proposed in embodiments of the present invention or those of the prior art, a brief description of the drawings that are necessary for describing the embodiments of the present invention or those of the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to technical solutions of the embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
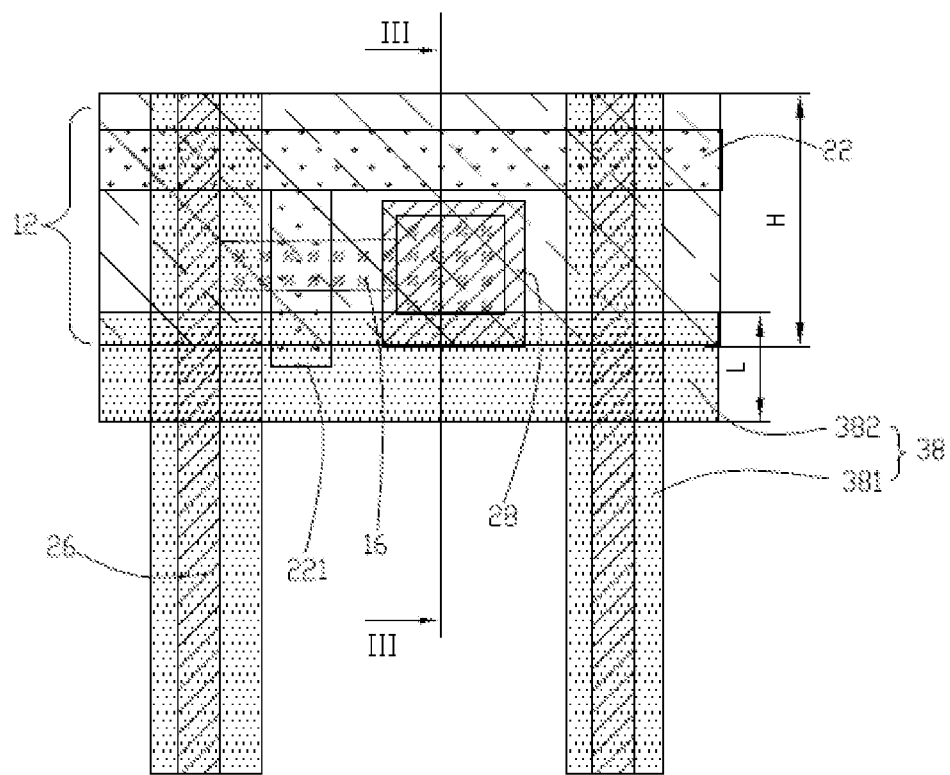
FIG. 1 is a top plan view of an LTPS array substrate according to a preferred embodiment of the present invention, which is a see-through view, in which different hatches indicate different layers.
Figure 2:
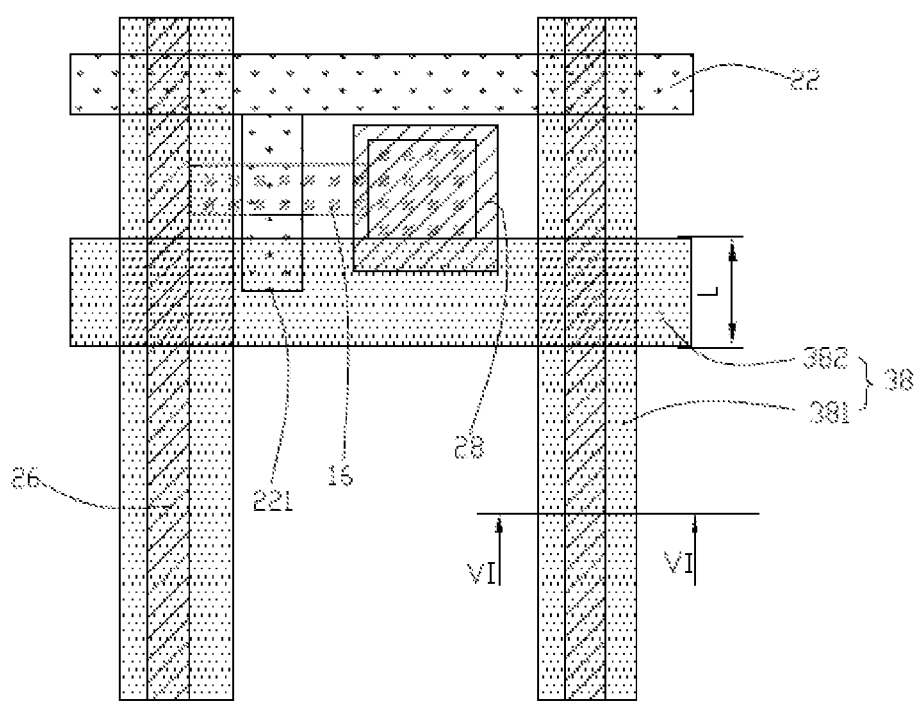
FIG. 2 is a schematic top plan view of the LTPS array substrate of FIG. 1, in which a light shield layer is removed.
Figure 3:
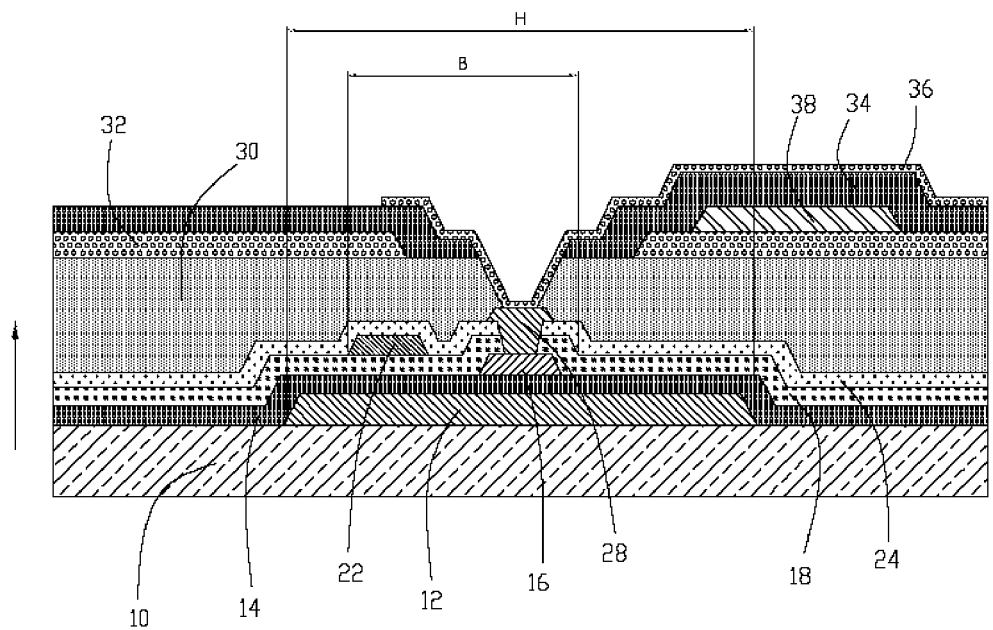
FIG. 3 is a cross-sectional view taken along line III-III of the LTPS array substrate of FIG. 1.

Referring to FIGS. 1, 2, and 3, the present invention provides a low temperature poly-silicone (LTPS) array substrate, which comprises a plurality of LTPS thin-film transistors and a bottom transparent conductive layer 32, a protective layer 34 formed on the bottom transparent conductive layer 32, and a top transparent conductive layer 36 formed on the protective layer 34. The instant embodiment will be described by taking a single one of the LTPS thin-film transistors as an example.

Each of the LTPS thin-film transistors comprises a substrate 10, a patterned light shield layer 12, a buffering layer 14, a patterned poly-silicon layer 16, a gate insulation layer 18, a first metal layer, an insulation layer 24, a second metal layer, and a planarization layer 30. The bottom transparent conductive layer 32 is formed on the planarization layer 30. The first metal layer is patterned to form a scan line 22. The second metal layer is patterned to form a data line 26 and a source/drain electrode 28. The data line 26 and the scan line 22 are arranged to intersect each other. A third metal layer 38 is formed between the bottom transparent conductive layer 32 and the protective layer 34.

Figure 4:
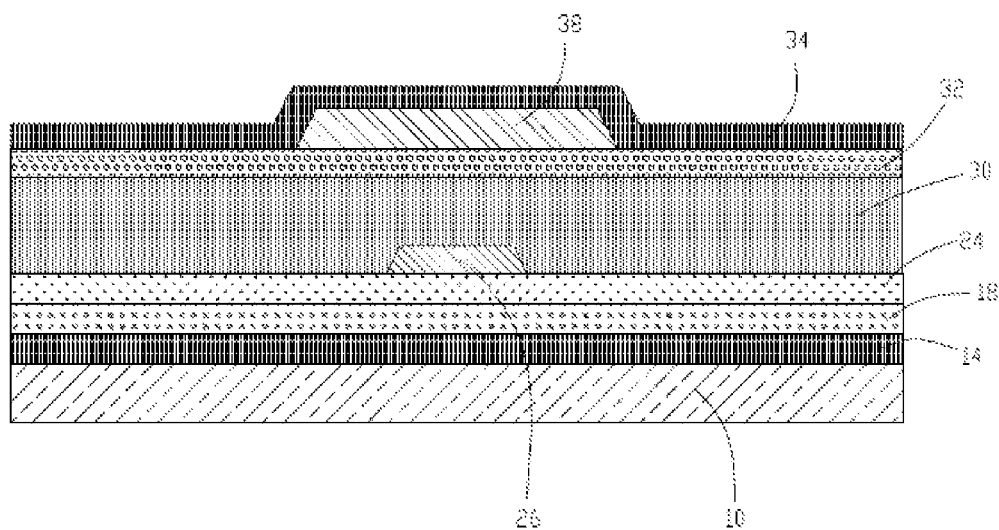
FIG. 4 is a cross-sectional view taken along line VI-VI of the LTPS array substrate of FIG. 2.

Referring additionally to FIGS. 3 and 4, a specific description will be given as follow:

The substrate 10 is commonly a transparent glass sheet.

The substrate 10 receives the patterned light shield layer 12 to formed thereon, wherein patternization refers to application of exposure and etching operations to the material of the light shield layer coated on the entire substrate 10 to finally form the patterned light shield layer 12. The light shield layer 12 functions to shield the portions of the thin-film transistor that require shielding of light, such as the scan line and the source/drain electrode. The light shield layer 12 comprises a material that is molybdenum/alloy alloys, chromium metal, molybdenum metal, or other materials having the properties of light shielding and electrical conductivity.

The buffering layer 14 is formed on the substrate 10 and the patterned light shield layer 12.

The patterned poly-silicon layer 16 is formed on the buffering layer 14. Here, patternization refers to formation through application of exposure and etching operations to poly-silicon coated on the buffering layer 14.

The gate insulation layer 18 is formed on the patternized poly-silicon layer 16 and the buffering layer 14. The gate insulation layer 18 is made of one of silicon oxide (SiOx), silicon nitride (SiNx), and silicon oxynitride (SiNxOy).

The first metal layer (not shown) is formed on the gate insulation layer 18 and the first metal layer is subjected to patternization to form the scan line 22 in such a way that an orthogonal projection of the scan line 22 is cast exactly on the light shield layer 12.

The insulation layer 24 is formed on the first metal layer. Etching is applied to form a first via (not shown) extending through the insulation layer 24 and the gate insulation layer 18 so that the first via exposes a portion of the patternized poly-silicon layer 16.

Referring to FIGS. 1 and 3, the second metal layer (not shown) is formed on the insulation layer 24 and the second metal layer is patterned to form the data line 26 and the source/drain electrode 28. The data line 26 and the scan line 22 are arranged to intersect each other. In the instant embodiment, the scan line 22 is arranged horizontal and the data line 26 is arranged vertical. The source/drain electrode 28 has an orthogonal projection cast on the light shield layer 12 and the data line 26 has an orthogonal projection partly cast on the light shield layer 12. In other words, when viewed in the direction indicated by the arrow shown in FIG. 3, the patternized light shield layer 12 shields the scan line 22 and the source/drain electrode 28 and the light shield layer 12 has a width H that is far greater that the longest distance S between the scan line 22 and the source/drain electrode 28. With the light shield layer 12 shielding the scan line 22 and the source/drain electrode 28, it is not necessary to form a black matrix above the scan line 22 and the source/drain electrode 28 for shielding light. This reduces the manufacturing operations and suitably reduces the size of the light shielding zone of a thin-film transistor.

In the instant embodiment, the second metal layer is formed on the insulation layer 24 and is electrically connected through the first via to the patternized poly-silicon layer 16. In other words, the source/drain electrode 28 is electrically connected, through the first via, to the patternized poly-silicon layer 16. The first metal layer and the second metal layer each comprise a material that is an electrically conductive material, such as molybdenum/aluminum alloys and chromium metal.

The planarization layer 30 is formed on the insulation layer 24 and the patternized second metal layer (the data line 26 and the source/drain electrode 28). The planarization layer 30 comprises a material of an organic film.

In the instant embodiment, the top transparent conductive layer 36 and the bottom transparent conductive layer 32 are respectively a pixel electrode layer and a common electrode layer of the array substrate. The top transparent conductive layer 36 is formed on the protective layer 34 and is electrically connected, through the second via that extends through the bottom transparent conductive layer 32, the protective layer 34, and the planarization layer 30, to the source/drain electrode 28. The bottom transparent conductive layer 32 and the top transparent conductive layer 36 are made of transparent conductive materials.

Further, the bottom transparent conductive layer 32 comprises a third metal layer 38 that is patternized to show a grid configuration formed thereon. The protective layer 34 is formed on the bottom transparent conductive layer 32, the patternized third metal layer 38, and the planarization layer 30. The patternized third metal layer 38 is located between the bottom transparent conductive layer 32 and the protective layer 34.

The patternized third metal layer 38 constitutes a touch sensing electrode layer. The patternized third metal layer 38 is of a grid configuration and comprises first zones 381 and second zones 382 that are arranged to intersect the first zones 381. The first zone 381 shields the data line 26. The second zone 382 has a portion overlapping a side portion of the light shield layer 12, the overlapping area being the side close to the source/drain electrode 28.

Specifically, the first zones 381 are arranged in a longitudinal direction and the second zones 382 are arranged in a lateral direction perpendicular to the first zones 381. Multiple first zones 381 and the first zones 381 constitute the grid configuration. The first zone 381 is located exactly above the data line 26 and the first zone 381 has a width slightly greater than a width of the data line 26 in order to shield light leakage of the data line 26. The second zone 382 has a width L and the second zone 382 has a portion of the orthogonal projection thereof cast on one side portion of the light shield layer 12. The width L of the second zone 382 and the width H of the light shield layer 12 partly overlap and the second zone 382 and the light shield layer 12 partly overlap so that the second zone 382 and the light shield layer 12 form an extended shielding zone in the widthwise direction and the shielding zone shields the LTPS thin-film transistors and other potential light leakage sites outside the thin-film transistor. The widthwise direction refers to a direction extending from the scan line 22 of the LTPS thin-film transistors toward the source/drain electrode 28.

In the instant embodiment, the scan line 22 comprises an extension zone 221 extending therefrom and covering the patternized poly-silicon layer 16. The extension zone 221 is shielded by the light shield layer 12 and extends into the overlapping area of the second zone 382 and the light shield layer 12.

The present invention provides an LTPS array substrate that has a patternized light shield layer 12 of which the width is increased so that the patternized light shield layer 12 shields the scan line 22 and the source/drain electrode 28 and partly overlaps a patternized third metal layer that serves as a touch sensing electrode layer, allowing for shielding of potential light leakage sites of the entirety of an LTPS thin-film transistor, and also, the patternized third metal layer 28 has a first zone 381 shields a data line 26, whereby the entire arrangement of the array substrate saves the manufacture of a black matrix and allows for reduction of the size of a light shielding zone of the array substrate so as to save masking operations and increase aperture ratio.

The above illustrates only a preferred embodiment according to the present invention and is not intended to limit the scope of right of the present invention. Those having ordinary skills of the art would appreciate that various equivalent modifications that achieve all or some of the operations of the above-described embodiment and fall within scope of the attached claims are considered within the scope covered by the present invention.

What is claimed is:

1. A low temperature poly-silicon (LTPS) array substrate, comprising a plurality of LTPS thin-film transistors, a bottom transparent conductive layer, a protective layer formed on the bottom transparent conductive layer, and a top transparent conductive layer formed on the protective layer, each of the LTPS thin-film transistors comprising a substrate;

a patternized light shield layer formed on the substrate;

a buffering layer formed on the substrate and the patternized light shield layer;

a patternized poly-silicon layer formed on the buffering layer;

a gate insulation layer formed on the patternized poly-silicon layer and the buffering layer;

a first metal layer formed on the gate insulation layer, the first metal layer being patternized to form a scan line, the scan line having an orthogonal projection cast on the light shield layer;

an insulation layer formed on the patternized first metal layer;

a second metal layer formed on the insulation layer, the second metal layer being patternized to form a data line and a source/drain electrode, the data line and the scan line being arranged to intersect each other;

a planarization layer formed on the insulation layer and the patternized second metal layer, the bottom transparent conductive layer being formed on the planarization layer, wherein:

the patternized light shield layer covers the scan line and the source/drain electrode, a patternized third metal layer being formed between the bottom transparent conductive layer and the protective layer, the patternized third metal layer comprises a first zone and a second zone arranged to intersect the first zone, the first zone shielding the data line, the second zone having a portion overlapping a side portion of the light shield layer that is close to the source/drain electrode so as to shield, in combination with the light shield layer, the source/drain electrode and a portion of the scan line.

2. The LTPS array substrate as claimed in claim 1, wherein the patternized third metal layer is a touch sensing electrode layer.

3. The LTPS array substrate as claimed in claim 1, wherein the scan line comprises an extension zone extending therefrom and covering a portion of the patternized poly-silicon layer, the extension zone being shielded by the light shield layer and the second zone.

4. The LTPS array substrate as claimed in claim 1, wherein the second zone and the light shield layer are arranged to partly overlap so that the second zone and the light shield layer for a shielding zone in a widthwise direction, the widthwise direction is a direction extending from the scan line of the LTPS thin-film transistor toward the source/drain electrode.

5. The LTPS array substrate as claimed in claim 1, wherein the patternized second metal layer is electrically connected through a via to the poly-silicon layer.

6. The LTPS array substrate as claimed in claim 1, wherein the top transparent conductive layer is formed on the protective layer and is electrically connected through a via to the source/drain electrode.

7. The LTPS array substrate as claimed in claim 1, wherein the gate insulation layer is made of one of silicon oxide, silicon nitride, and silicon oxynitride.

8. The LTPS array substrate as claimed in claim 1, wherein the first metal layer and the second metal layer comprise materials that are electrically conductive materials of molybdenum/aluminum alloys and chromium metal.

9. The LTPS array substrate as claimed in claim 1, wherein the bottom transparent conductive layer and the top transparent conductive layer are made of transparent conductive materials.

10. The LTPS array substrate as claimed in claim 1, wherein the third metal layer has a grid configuration.

\* \* \* \* \*